United States Patent
Andersson

(12)
(10) Patent No.: US 6,292,089 B1
(45) Date of Patent: *Sep. 18, 2001

(54) STRUCTURES FOR TEMPERATURE SENSORS AND INFRARED DETECTORS

(75) Inventor: Jan Andersson, Solna (SE)

(73) Assignee: IMC Industriellt Mikroelektronikcentrum AB, Kista (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,597

(22) PCT Filed: Jan. 10, 1997

(86) PCT No.: PCT/SE97/00025

§ 371 Date: Jul. 10, 1998

§ 102(e) Date: Jul. 10, 1998

(87) PCT Pub. No.: WO97/25600

PCT Pub. Date: Jul. 17, 1997

(30) Foreign Application Priority Data

Jan. 11, 1996 (SE) .................................................. 9600097

(51) Int. Cl.[7] ...................................................... H01L 3/04

(52) U.S. Cl. ................................ 338/25; 338/15; 338/18; 257/14; 257/22

(58) Field of Search ................................. 338/15, 18, 17, 338/25, 225 D; 374/32; 257/9, 14, 15, 21, 22, 184; 250/338.4

(56) References Cited

U.S. PATENT DOCUMENTS

| Re. 36,136 | * | 3/1999 | Higashi et al. | 338/18 |
|---|---|---|---|---|
| 4,711,857 | * | 12/1987 | Cheng | 257/21 |
| 5,182,670 | * | 1/1993 | Kahn | 257/21 |
| 5,228,777 | | 7/1993 | Rosencher et al. | 374/32 |
| 5,300,789 | * | 4/1994 | Gorfinkel et al. | 257/21 |
| 5,424,559 | * | 6/1995 | Kasahara | 257/21 |
| 5,426,412 | * | 6/1995 | Tomonari et al. | 338/18 |
| 5,450,053 | | 9/1995 | Wood | 338/18 |
| 5,488,226 | | 1/1996 | Iafrate et al. | 250/338.4 |
| 5,528,051 | * | 6/1996 | Nuyen | 257/21 |
| 5,646,421 | * | 7/1997 | Liu | 257/21 |
| 5,703,379 | * | 12/1997 | Le Person et al. | 257/21 |
| 5,869,844 | * | 2/1999 | Rosencher et al. | 257/21 |

FOREIGN PATENT DOCUMENTS

| 0534768 | 3/1993 | (EP) . |
|---|---|---|
| WO9116607 | 10/1991 | (WO) . |
| WO9313561 | 7/1993 | (WO) . |

* cited by examiner

*Primary Examiner*—Karl D. Easthom
(74) *Attorney, Agent, or Firm*—Alfred J. Mangels

(57) ABSTRACT

A structure for temperature sensors and infrared detectors. The structure is built-up on a substrate that includes a thermistor layer, wherein the resistance of the thermistor layer is temperature dependent. The substrate also includes an electric contact layer on both sides of the thermistor layer, and the resistance of the thermistor layer is measured between the contact layers. The thermistor layer includes a monocrystalline quantum well structure that includes alternating quantum well layers and barrier layers. One or more of the bandedge energy of the barrier layers, the quantum well layer doping level, the quantum well layer thickness, and the barrier layer thickness is adapted to obtain a temperature coefficient predetermined for the structure.

12 Claims, 3 Drawing Sheets

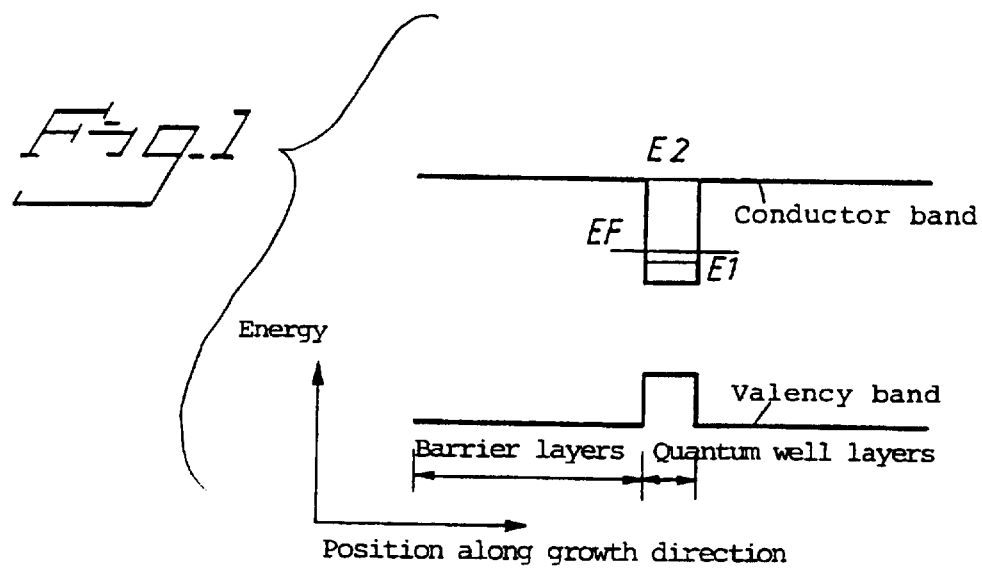
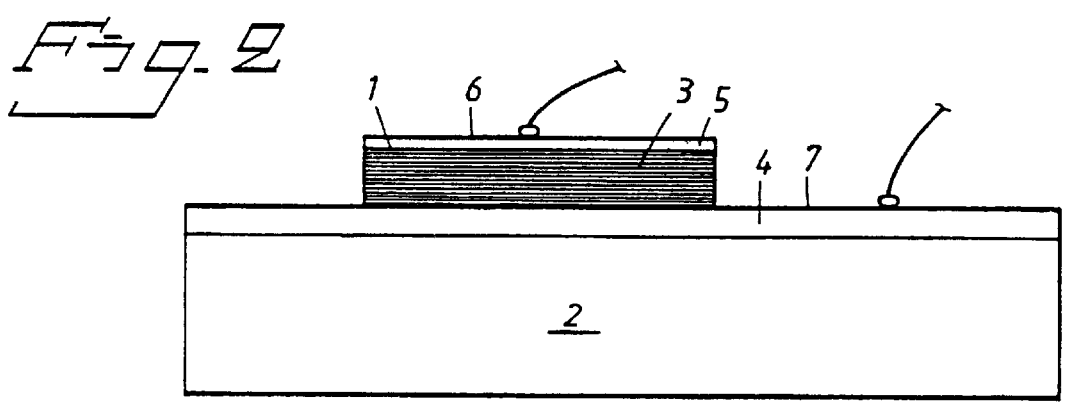
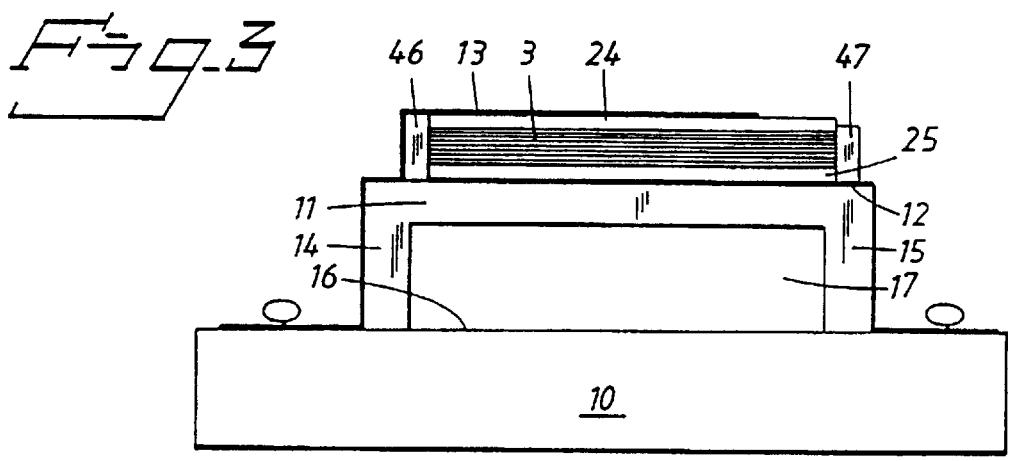

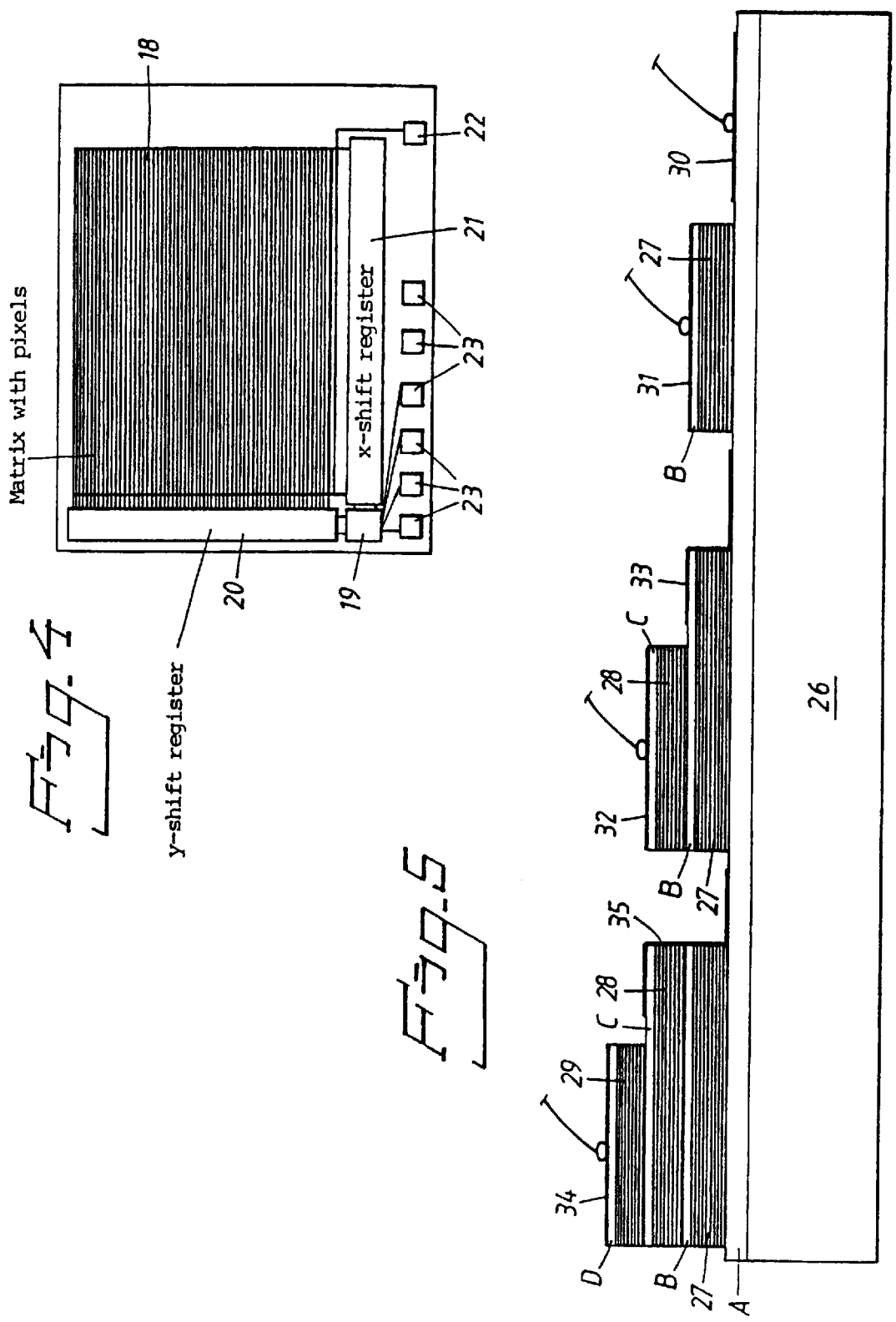

STRUCTURES FOR TEMPERATURE SENSORS AND INFRARED DETECTORS

BACKGROUND OF THE INVENTION

1. Field of the Invention

The present invention relates to structures for temperature sensors and infrared detectors.

2. Description of the Related Art

Infrared detectors, so-called IR-detectors, are divided generally into two main groups, namely photon detectors and thermal detectors.

Photon detectors are based on the immediate excitation of charge carriers by IR-absorption, wherein the change level of the charge carriers is detected electronically. Photon detectors are fast and sensitive, but have the drawback of needing to be cooled to cryogenic temperatures.

Thermal detectors are based on a two-stage process wherein IR absorption occurs in a detector structure which is heated thereby. The temperature change is detected by means of an integrated temperature sensor. Examples of thermal detectors are resistive bolometers, thermoelements, pn-diodes, pyroelectric sensors, etc. Thermal detectors have the advantage of being able to operate at room temperature, but have the disadvantage of being less sensitive and slower than photon detectors. Sensitivity and speed are not of paramount importance in the case of detector matrices, and consequently non-cooled thermal detectors are of the greatest interest with regard to detector matrices.

Irrespective of whether IR-radiation is measured with thermal detectors that are based on the increase in temperature of a detector structure due to IR-radiation, or whether the detector structure is heated as a result of being in heat conducting contact with a material whose temperature is to be measured, the problems encountered with known temperature sensors are the same.

The problem with known temperature sensors, or thermal detectors of the aforesaid kind, is that either the output signal is weak or the noise level is high, and consequently a common drawback is that the signal-noise ratio is low.

A sufficiently high signal-noise ratio is necessary in order to obtain a high degree of sensitivity. When measuring rapid temperature changes, the possibilities of filtering out or integrating away the noise are limited.

In the case of resistive bolometers, the material or structure must therefore have a sufficiently high temperature coefficient and a low noise level.

Known bolometer materials are either metals or semiconductor materials. Although the latter materials have the advantage of a high temperature coefficient they, unfortunately, also have a high noise level. The noise may be of a fundamental nature, such as Johnson noise or generation-recombination noise, meaning that the noise is difficult or impossible to reduce. Alternatively, the noise may be 1/f noise, where f is the frequency, deriving from poor electrical contacts, impurities, contaminants, and so on. When a sensitive detector is required, it is often necessary to use a semiconductor material as the bolometer layer. Metals can be used only when the bias voltage can be high, which often results in high power generation. This is normally unacceptable in detector matrices that include a large number of detector elements.

Amorphous or polycrystalline material deposited from a gas phase is normally used as semiconductor bolometer material. This is because the layer is normally applied on thin silicon nitride films. The amorphous or polycrystalline nature of the layers gives rise to 1/f noise in both the layers themselves and in the electric contacts with the surroundings. This noise is generated by the multitude of grain boundaries in a polycrystalline structure, among other things.

The present invention solves the problem of a low signal-noise ratio, by using a special thermistor material. Furthermore, according to the invention, a semiconductor material can be designed to enable its temperature coefficient to be selected.

SUMMARY OF THE INVENTION

The present invention thus relates to a structure for temperature sensors and infrared detectors based on a substrate which includes a thermistor layer whose resistance is temperature dependent the substrate further includes an electric contact layer on both sides of the thermistor layer, between which contact layers the resistance is measured. The thermistor layer includes a monocrystalline quantum well structure which includes alternating quantum well layers and barrier layers.

BRIEF DESCRIPTION OF THE DRAWINGS

The invention will now be described in more detail with reference to exemplifying embodiments thereof and also with reference to the accompanying drawings, in which FIG. 1 is a quantum well band diagram;

FIG. 2 illustrates a temperature sensor intended for heat conductive contact with a material whose temperature is to be measured;

FIG. 3 is a thermal detector for measuring IR-radiation;

FIG. 4 illustrates a detector matrix;

FIG. 5 illustrates an embodiment which includes three detector mesas

DESCRIPTION OF THE PREFERRED EMBODIMENTS

Figure 6:
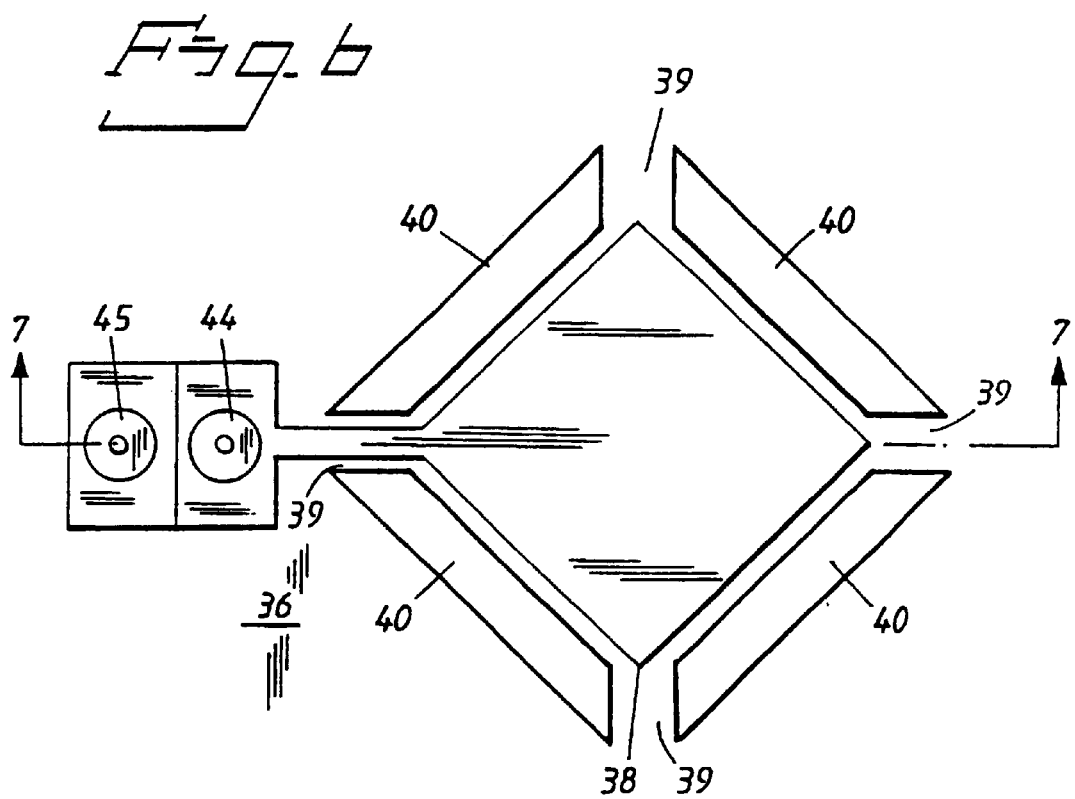
FIG. 6 illustrates from above an alternative to a detector according to FIG. 3.

By quantum well is meant thin semiconductor layers, so-called quantum well layers, in which charge carriers have lower energy than surrounding layers, so-called barrier layers. Quantum well layers and barrier layers are both monocrystalline and mutually lattice adapted. Energy quantization will occur when the quantum bridge layers are thin, e.g. in the order of 2.5–20 nanometers, therewith influencing permitted energy levels of the charge carriers. FIG. 1 illustrates how the energy of the band edges varies with the position parallel to the growth direction of a quantum well structure.

With regard to thermistor material of the quantum well type, the detector temperature coefficient B will generally be equal to $(E2-EF)/kT^2$, where E2-EF is the activation energy, see FIG. 1, k is Boltzmann's constant and T is the temperature. EF is the Fermi energy, which can be said to constitute the limit between an area or region populated by charge carriers and an unpopulated area or region.

FIG. 2 illustrates a structure 1 for temperature sensors and infrared detectors built on a substrate 2 which includes a thermistor layer 3 whose resistance is temperature dependent and which further includes electric contact layers 4, 5 on both sides of the thermistor layer 3, between which contact layers the resistance is intended to be measured.

According to the invention, the thermistor layer 3 is comprised of a monocrystalline quantum well structure that includes alternating quantum well layers and barrier layers.

A structure of this nature is fabricated epitaxially from a monocrystalline substrate 2 on whose surface new material is grown, and the structure is progressively built-up while retaining a crystalline structure. This enables a series of thin, planar quantum well layers and barrier layers to be built-up in alternating and superimposed relationship. Quantum well structures are normally fabricated by metal organic gas phase epitaxy (MOVPE) or molecular beam epitaxy (MBE).

With regard to quantum wells, the activation energy is equal to the band-edge energy minus the Fermi energy. The former depends on the composition of the barrier layer, whereas the latter depends on the width and doping extent of the quantum well layer and the composition of the barrier layer.

When the quantum well layer is thick and doping lean, the Fermi energy is low.

The greatest activation energy and therewith the greatest temperature coefficient is thus obtained when the composition of the barrier layer produces a high band-edge energy, when doping is lean, or low, and when the quantum well layer is thick.

At room temperature, a temperature coefficient of 5% corresponds with an activation energy of 0.39 eV. The band-edge energy E2 of a barrier layer comprised of $Al_{0.45}Ga_{0.05}As$ is 0.39 Ev compared with GaAs. The Fermi energy lies at about 0.07 Ev. This results in an activation energy of 0.32 electron volt, which corresponds to a temperature coefficient of 4.1%. It can be mentioned by way of comparison that the majority of known thermistor materials give a temperature coefficient of only from 2 to 3%. Values higher than 4.1% can be obtained with other material combinations of the barrier and quantum well layers.

According to one preferred embodiment, the substrate is comprised of a sheet of gallium arsenide, wherein the quantum well layers are comprised of n-doped indium gallium arsenide and wherein the barrier layers are comprised of non-doped aluminum gallium arsenide.

According to another preferred embodiment, the substrate is comprised of a sheet of silicon, wherein the quantum well layers are comprised of p-doped silicon germanium and wherein the barrier layers are comprised of non-doped silicon. According to a third preferred embodiment, the substrate is comprised of a sheet of gallium arsenide, wherein the quantum well layers are comprised of n-doped indium gallium arsenide and wherein the barrier layers are comprised of non-doped aluminum gallium arsenide.

According to a fourth preferred embodiment, the substrate is comprised of a sapphire sheet, i.e. monocrystalline aluminum oxide, wherein the quantum well layers are comprised of n-doped gallium nitride and wherein the barrier layers are comprised of undoped aluminum gallium nitride.

The advantage with these preferred embodiments is that the material combinations are well known, as is also the technique of producing the quantum well structures. This results in high reproducibility and low costs. In addition, it is possible to fabricate different kinds of electronic circuits on the same substrate as the quantum well structures.

According to one very important embodiment of the invention, one tor more of the parameters barrier layer band-edge energy, doping level of the quantum well layers, quantum well layer thickness and barrier layer thickness is/are adapted to obtain a predetermined temperature coefficient for the structure concerned. As before mentioned, the structure can be given a predetermined temperature coefficient by using a quantum well structure as a thermistor layer.

The present invention thus affords a high degree of manufacturing flexibility. As before mentioned, the layer sequence, the layer composition, the layer thickness and the doping level can be varied.

In addition to controlling the temperature coefficient, noise can also be controlled within wide limits and relatively independent of the temperature coefficient.

Quantum well structures also have a low 1/f noise level, because the structures are monocrystalline. In addition, good low-noise, ohmic contacts can be obtained.

The person skilled in this art will have no difficulty in selecting different material combinations and dimensions and doping degrees in obtaining a desired temperature coefficient and low noise.

The performance of a thermistor layer can be expressed in simplest terms as the least temperature difference which results in a change in the detector output signal that is equal to detector noise, hereinafter designated NET. In the case of a detector of the present kind, NET shall be proportional to the detector noise voltage and inversely proportional to the detector temperature coefficient. A sensitive detector must thus have a high temperature coefficient and a low noise level.

The total noise of the detector material is comprised of Johnson noise, gr noise and 1/f noise. Johnson noise derives from the total resistance over the structure and from the noise band width. One characteristic of this type of noise is that it is not due primarily to the applied bias voltage or bias current, as distinct from gr noise and 1/f noise. gr noise stands for generation-recombination noise and increases when the generation rate r and the internal amplification g increase. The generation rate normally decreases as the activation energy increases. The internal amplification is influenced by the lifetime of the charge carriers. This magnitude can be varied by varying the status of the upper energy state E2.

One problem is that when the temperature coefficient increases, the resistance across the structure also increases. The desirable combination of a high temperature coefficient and low resistance is obtained when the time taken for the charge carriers to pass between the contacts on opposite sides of the structure is of short duration. This can thus be achieved when the charge carriers have high mobility.

Quantum well structures afford a high degree of flexibility when choosing a high temperature coefficient with a high generation rate.

With a detector of the present kind, it is possible to obtain NET values=$0.5 \times 10^{-6}$ to $1 \times 10^{-6 \circ}$ K., when the noise band width is 1 Hz.

FIG. 2 illustrates a structure adapted for measuring the temperature of a material with which the substrate 2 is in heat-conducting contact, wherein the thermistor layer 3 is heated by thermal conduction. The aforesaid first contact layer 4 is mounted on top of the substrate 2 and the quantum well structure 3 is located on part of the contact layer 4. The second contact layer 5 is located on top of the quantum well structure. The overall structure also includes respective metallic contact layers 6, 7 on top of the first contact layer to one side of the quantum well structure, and on top of the second contact layer.

Examples of applications for a temperature sensor of this kind are calorimetry for registering chemical processes, applications which require measuring within a large temperature range, and measuring cryogenic temperatures, i.e. temperatures beneath 100° K.

In calorimetry, it may be desired to determine very small changes in temperature and to measure rapid sequences. An application of thermal flow calorimetry is one in which the thermal flow is measured and integrated with respect to time. In this application, two or more detectors are spaced at a given distance apart and the temperature difference between said detectors determined, which will indicate the thermal flow provided that the thermal conductivity of the medium, its geometry, etc., are known.

FIG. 3 illustrates a structure for measuring incident IR-radiation, which falls onto the structure from above in FIG. 3 and heats the quantum well layer, the thermistor layer, 3. Located on top of the substrate 10 is a membrane 11 on which the quantum well structure 3 is located, wherein the quantum well structure includes contact layers 24, 25 above and beneath the quantum well structure, respectively, and is provided with a respective metallic contact layer 12, 13 beneath and on top of the contact layers 24, 25. The membrane 11 is parallel with and spaced from the surface of the substrate 10 on legs 14, 15 provided between the membrane 11 and the substrate surface 16. The reference numerals 46 and 47 identify electrically insulating layers between the conductor 13 and the quantum well structure 3.

The space 17 beneath the membrane 11 of the FIG. 3 embodiment is filled with gas or is placed under a vacuum, so as to wellinsulate the thermistor layer.

The structure illustrated in FIG. 3 may be fabricated in accordance with the short description given below.

Quantum well structures are grown on a first substrate, for instance a gallium arsenide or monocrystalline silicon substrate, whereafter detector mesas are etched out and provided with electric contacts.

A sacrificial layer, for instance the polymer polyimide, is applied on a second substrate and etched to a desired size. The top surface and side surfaces of the sacrificial layer are then provided with a support member in the form of membrane layer, for instance a silicon nitride layer. The silicon nitride layer is patterned and etched to the configuration shown in FIG. 3. An electrically conductive layer is applied on top of the membrane and passed down to the silicon substrate.

Electric contacts on the quantum well structure are then connected with the contacts on the upper surface of the membrane with the aid of flip-chip bonding.

The first substrate is then removed, so that only the quantum well structure remains, this structure thus being bonded to the membrane.

Contacts are then applied to the upper surface of the quantum well structure and the quantum well structures are then etched free from one another.

Finally, the sacrificial layer is etched away beneath the membrane.

Figure 7:
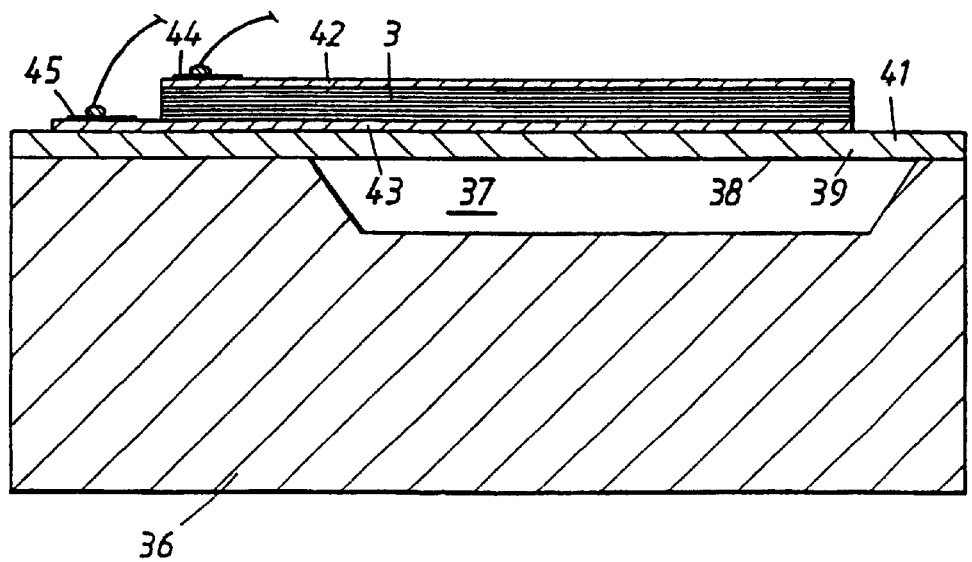
FIG. 7 is a sectional view taken on the line 77 in FIG. 6.

An alternative method of achieving thermal isolation of the quantum well structure is to fabricate in a substrate, optionally provided with epitaxially grown layers, a free-hanging membrane which is in mechanical connection with the remainder of the substrate via thin, narrow legs which lie parallel with the substrate surface. The degree of thermal insulation is determined by the material properties and dimensions of the legs. In this case, the quantum well structure is supported by the membrane. One such embodiment is illustrated in FIGS. 6 and 7.

Fabrication is effected by etching away a cavity 37 in the substrate 36, such as to leave a membrane 38 and legs 39. The etching process is conveniently effected by first exposing one or more openings 40 photolithographically and then under-etching the membrane with the aid of anisotropic and/or selective etches. The use of a gallium arsenide substrate has an advantage in this respect, insomuch that the grown, thin epitaxial layer 41 of aluminium gallium arsenide can be used as an etching stop when selectively etching the membrane 38.

There are two main ways of applying the quantum well structures 3 to the membrane.

A first way is from grow the quantum well layers on the substrate in which the cavities 37 are etched. The quantum well layers are provided with a top 42 and a bottom 43 contact layer. In this case, fabrication is effected by first producing quantum well structures that include mesas. The top and bottom contact layers 42, 43 are provided with electric contacts 44, 45. The aforesaid openings 40 are exposed photolithographically and the cavity then etched out.

Alternatively, the quantum well layers may be grown on a substrate that is different to the substrate in which the cavities are produced. In this case, the quantum well structures are bonded to the sheet in which the cavities are etched with the aid of flip-chip bonding.

According to one preferred embodiment of the invention, thermistor layers of mutually different activating energies are integrated on one and the same chip.

Because the temperature coefficient and the resistance both depend on temperature, a very large temperature range can be sensed with low NET. A range of between 0–400° K. can be sensed, or detected, with AlGaAs/GaAs structures. A low activation energy is optimal at low temperatures, whereas, conversely, a high activation energy is optimal at high temperatures.

Two or more quantum well structures including quantum well layers and intermediate barrier layers of different activation energies can be formed on one and the same substrate in accordance with the following description.

A first contact layer A is provided on the substrate surface. A first quantum well structure having a first activation energy is provided on top of the first contact layer and a second contact layer B is provided on top of the first quantum well structure. There then follows a second quantum well structure, a third quantum well structure, and so on, that have individual activation energies, with a contact layer between each quantum well structure. A contact layer are provided on the uppermost quantum well structure; see FIG. 5.

The structure has been etched to leave the two contact layers surrounding each of the quantum well structures. The contact layer pairs thus produced for each of the quantum well structures are connected to electric contacts.

The fabrication of such a structure is illustrated with reference to FIG. 5. There is first grown a highly doped contact layer A on the surface of the substrate 26. There is then grown about fifty quantum well layers 27 having a first activation energy. A highly doped contact layer B is then grown, and thereafter about fifty quantum well layers 28 having a second activation energy, and a third highly doped contact layer C. There are then grown about fifty quantum well layers 29 having a third activation energy. Finally, when three activation energies are desired, there is grown a highly doped fourth contact layer D. In the subsequent fabrication of detector mesas, the structure is etched down to the layers A and B for the first activation energy, these layers each being connected to a respective contact layers 30, 31. For the second activation energy, the structure is etched down to the contact layers B and C, whereafter the contact layers B and C are connected to respective contact layers 32, 33. For the third activation energy, the structure is etched down to the contact layers C and D, whereafter the contact layers C and D are connected to respective contact layers 34, 35. The contact layers 33 and 35 are connected to the contact layer A, which functions as an earth layer.

It will be evident that two ormore different temperature sensors having mutually different activation energies can be fabricated in the same way, wherein a requisite number of contact layers are produced with intermediate quantum well structures, whereafter detector mesas are etched forwards so as to enable contact layers surrounding each quantum well structure to be connected to electric contacts.

As illustrated in FIG. 4, a detector matrix 18 is built-up with a multiple of mutually parallel quantum well structures disposed in rows (x-direction) and columns (y-direction).

The performance measurement NETD is used for detector matrices intended for thermovision, this measurement denoting the smallest temperature change that can be detected in the surroundings. NETD is mainly determined by the degree of thermal insulation of the quantum well structure, and secondly by the noise characteristics of the detector. An NETD of about 40 mK can be achieved with the present invention.

The picture elements of a detector matrix for thermovision are normally disposed in a rectangular pattern that includes, e.g., 320 columns and 240 rows. Each picture element has a size of about 50×50 micrometers. A detector matrix is provided with an electronic control device 19 which, via a y-shift register 20 and an x-shift register 21, reads each detector element per se and forms a serial signal which is taken out on an output 22. The detector matrix also includes a number of terminals 23 for voltage supply, control signals, etc.

The electronic control -device, the shift registers and the terminals, are built-up on one and the same substrate. The detector elements are built-up on another substrate which is flip-chip bonded to the first-mentioned substrate.

It will be understood from the aforegoing that the problems recited in the introduction are solved by the present invention, which implies the use of quantum well structures as thermistor layers whose construction can be varied to obtain desired temperature coefficients and which have a high signal/noise ratio.

It will also be obvious to the person skilled in this art that all material combinations from which quantum well structures can be built-up and which give the aforesaid effects are suitable for use in the present context.

The present invention is therefore not restricted to the aforedescribed and illustrated exemplifying embodiments thereof, since variations can be made within the scope of the following Claims.

What is claimed is:

1. A temperature sensing structure comprising:
   a. a substrate;
   b. a thermistor layer carried by the substrate and having a resistance that is inversely related to temperature, the thermistor layer including a monocrystalline quantum well structure that includes alternating quantum well layers and barrier layers;
   c. a first electric contact layer on a first face of the thermistor layer; and
   d. a second electric contact layer on a second face of the thermistor layer, wherein the thermistor layer has a resistance that is measured between the fast and second electric contact layers, and wherein a parameter selected from the group consisting of barrier layer band-edge energy, doping level of the quantum well layers, quantum well leyer thickness, barrier layer thickness, and combinations thereof is selected to obtain a temperature coefficient for the structure that is at least 4.0% at room temperature.

2. A structure according to claim 1, wherein the substrate includes a sheet of gallium arsenide; and wherein the quantum well layers include n-doped gallium arsenide and the barrier layers include undoped aluminum gallium arsenide.

3. A structure according to claim 1, wherein the substrate includes a silicon sheet; and wherein the quantum well layers include p-doped silicon-germanium and the barrier layers include undoped silicon.

4. A structure according to claim 1, wherein the substrate includes a sheet of gallium arsenide; and wherein the quantum well layers include n-doped indium gallium arsenide and the barrier layers include undoped aluminum gallium arsenide.

5. A structure according to claim 1, wherein the substrate includes a sheet of monocrystalline aluminum oxide, and wherein the quantum well layers include n-doped gallium nitride and the barrier layers include undoped aluminum gallium nitride.

6. A structure according to claim 1 for measuring the temperature of a material with which the substrate is intended to be in heat-conductive contact, wherein the first electric contact layer is provided on top of the substrate, and a quantum layer structure is provided on top of at least a part of said first contact layer, and the second electric contact layer is provided on top of the quantum well structure; and a first metallic contact is provided on a portion of an upper surface of the first electric contact layer to one side of the quantum well structure, and a second metallic contact is provided on a portion of an upper surface of the second electric contact layer.

7. A structure according to claim 6, including at least two quantum well structures, each of which includes quantum well layers and intermediate barrier layers, wherein the quantum well structures have mutually different activation energies and are carried on one and the same substrate.

8. A structure according to claim 7, wherein the first electric contact layer is provided on a surface of the substrate and a first quantum well structure having a first activation energy is provided on top of the first contact layer; at least one successive second quantum well structure overlies the first quantum well structure, each quantum well structure having an individual activation energy, wherein each quantum well structure is separated from an adjacent quantum well structure by an electric contact layer; and an upper electric contact layer is provided on the uppermost surface of the uppermost quantum well structure; and wherein the structure is etched so as to expose portions of said intermediate contact layers, said pair of contact layers being connected to respective electric contacts.

9. A structure according to claim 1 for measuring incident IR-radiation, wherein the structure includes a support member adjacent to the substrate and the quantum well structure is positioned on top of said support member, wherein the first electric contact layer is provided beneath the quantum well structure and the second electric contact layer is provided on top of the quantum well structure; and legs positioned between the support member and the substrate to support the support member in substantially parallel and spaced relationship with a surface of the substrate.

10. A structure according to claim 9, including at least two quantum well structures, each of which includes quantum well layers and intermediate barrier layers, wherein the quantum well structures have mutually different activation energies and are carried on one and the same substrate.

11. A structure according to claim 1 for measuring incident IR-radiation, wherein a support member is positioned between the substrate and the quantum well structure; the first electric contact layer is positioned below the quantum well structure and the second electric contact layer is positioned above the quantum well structure; wherein the support member is substantially parallel with a surface of the substrate and is connected mechanically with the substrate by legs extending between the support member and the substrate, said legs being parallel with the substrate surface; and a cavity formed in the substrate and which extends between said legs and below the quantum well structure.

12. A structure according to claim 11, including at least two quantum well structures, each of which includes quantum well layers and intermediate barrier layers, wherein the quantum well structures have mutually different activation energies and are carried on one and the same substrate.

* * * * *

UNITED STATES PATENT AND TRADEMARK OFFICE
CERTIFICATE OF CORRECTION

PATENT NO. : 6,292,089 B1
DATED : September 18, 2001
INVENTOR(S) : Jan Andersson It is certified that error appears in the above-identified patent and that said Letters Patent is hereby corrected as shown below:

<u>Column 8, claim 1,</u>
Line 3, "fast" should read -- first --; and
Line 7, "leyer" should read -- layer --.

Signed and Sealed this

Twenty-sixth Day of February, 2002

*Attest:*

JAMES E. ROGAN
*Attesting Officer*     *Director of the United States Patent and Trademark Office*